United States Patent
Choi et al.

(10) Patent No.: US 9,983,230 B2
(45) Date of Patent: May 29, 2018

(54) PROBE PIN AND MANUFACTURING METHOD THEREOF

(71) Applicants: Seon Young Choi, Seongnam (KR); Yurie Nakamura, Nakano (JP)

(72) Inventors: Seon Young Choi, Seongnam (KR); Yurie Nakamura, Nakano (JP); Hong Dae Lee, Seongnam (KR)

(73) Assignees: Seon Young Choi, Seongnam-si (KR); Yurie Nakamura, Nakanoshi (JP)

( * ) Notice: Subject to any disclaimer, the term of this patent is extended or adjusted under 35 U.S.C. 154(b) by 0 days. days.

(21) Appl. No.: 15/050,534

(22) Filed: Feb. 23, 2016

(65) Prior Publication Data

US 2017/0219623 A1 Aug. 3, 2017

(30) Foreign Application Priority Data

Jan. 29, 2016 (KR) ........................ 10-2016-0011083

(51) Int. Cl.
*G01R 1/067* (2006.01)
*G01R 1/073* (2006.01)

(52) U.S. Cl.
CPC ..... *G01R 1/06722* (2013.01); *G01R 1/07314* (2013.01)

(58) Field of Classification Search
CPC .. G01R 1/073–1/07392; G01R 1/067–1/06794
USPC ........... 324/754.01–758.05; 439/482, 65–68, 439/219, 91, 884, 700, 169
See application file for complete search history.

(56) References Cited

U.S. PATENT DOCUMENTS

| | | | | |
|---|---|---|---|---|
| 7,749,032 B1* | 7/2010 | Yin | ..................... | H01R 13/2421 439/482 |
| 8,519,727 B2* | 8/2013 | Yamamoto | ......... | G01R 1/06722 324/755.05 |
| 9,128,120 B2* | 9/2015 | Lee | ..................... | G01R 1/06722 |
| 2010/0285698 A1* | 11/2010 | Lee | ..................... | G01R 1/06722 439/786 |

* cited by examiner

*Primary Examiner* — Melissa Koval
*Assistant Examiner* — Rahul Maini
(74) *Attorney, Agent, or Firm* — Lex IP Meister, PLLC

(57) ABSTRACT

A probe pin according to an embodiment of the present invention has a two-piece structure consisting of a pogo pin part and a barrel part, in which the pogo pin part includes an upper plunger having an outside contact point at an upper end, a lower plunger having an outside contact point at a lower end, and a spring portion composed of one or more springs and connected to a lower end of the upper plunger and an upper end of the lower plunger; and the barrel part has a cylindrical shape surrounding a portion of the pogo pin part and has a barrel-fixing spring portion protruding on an outer side of the barrel part to apply elasticity outward.

8 Claims, 14 Drawing Sheets

--Prior Art--

PROBE PIN AND MANUFACTURING METHOD THEREOF

BACKGROUND OF THE INVENTION

Field of the Invention

The present invention relates to a probe pin and a manufacturing method thereof and, more particularly, to a probe pin that has a two-piece structure consisting of a pogo pin part and a barrel part and absorbs shock using a spring at the middle portion.

Description of the Related Art

In general, spring type probe pins having an up-down foldable structure are used for electric and electromechanical parts such as a test socket for testing elements on a wafer and semiconductor chip packages.

Various spring type probe pins have been known, for example, in Korean Patent No. 10-1021634, in which a spring is connected between upper and lower foldable parts to absorb shock when a load is longitudinally applied.

FIG. 1 is a cross-sectional view showing a socket combining structure of a probe pin in the related art and FIG. 2 is an exploded view of the structure shown in FIG. 1. As show in FIGS. 1 and 2, a socket where a barrel-locking type probe pin 810 is inserted is composed of two bodies, an upper socket 805 and a lower socket 807, and an upper hole 811 and a lower hole 815 are formed at the upper socket 805 and the lower socket 807, respectively.

An upper locking groove 813 and a lower locking groove 817 are formed at the centers of the upper hole 811 and the lower hole 815, respectively, and a locking projection 803 is formed on the outer side at the middle portion of the barrel-locking type probe pin 801.

According to this configuration, the barrel-locking type probe pin 801 is inserted into the lower hole 815 of the lower socket 807 and then the upper socket 805 is coupled to the top of the lower socket 807, in which the barrel-locking type probe pin 801 inserted in the lower hole 815 of the lower socket 807 is inserted into the upper hole 811 of the upper socket 805.

In this process, the locking projection 803 formed on the outer side at the middle portion of the barrel-locking type probe pin 801 is inserted into the upper locking groove 813 at the center of the upper hole 811 of the upper socket 805 and the lower locking groove 817 at the center of the lower hole 815 of the lower socket 807, so separation is prevented.

In the related art, however, since the barrel-locking type probe pin 801 is combined with the upper socket 805 and the lower socket 807 that are separated up and down, the barrel-locking type probe pin 801 is complicated to manufacture and may be damaged in the combining process.

Further, it is required to precisely align the upper hole 811 and the lower hole 815 for combining the barrel-locking type probe pin 801 with the upper socket 805 and the lower socket 807, so manufacturing is complicated and accordingly large costs are required for manufacturing and combining.

Further, since the barrel-locking type probe pin 801 is inserted into the upper hole 811 of the upper socket 805 after being inserted into the lower hole 815 of the lower socket 807, workability for combining and separating the probe pin is poor. In particular, if the lower socket 807 is turned inside out in the process of inserting the barrel-locking type probe pin 801 into the lower hole 805 of the lower socket 807, the barrel-locking type probe pin 801 comes out of the lower hole 805 and is required to be inserted again, so combining is inconvenient.

DOCUMENT OF RELATED ART

Patent Document

Korean Patent No. 10-1031634 (Apr. 20, 2011)

SUMMARY OF THE INVENTION

An object of the present invention is to provide a probe pin that can be simply manufactured and combined and can be prevented from being damaged by forming a protruding barrel-fixing spring portion on the outer side of a barrel part to be fixed by elasticity of the barrel-fixing spring portion when being combined, and a method of manufacturing the probe pin.

Another object of the present invention is to provide a probe pin and a method of manufacturing the probe pin that can reduce the manufacturing and combining costs by making a socket or a housing for keeping the probe pin in a simple structure.

Further, another object of the present invention is to provide a probe pin that can be more conveniently combined by being inserted into one hole formed at a socket or a housing in a spring-fixing type so that the probe pin is not separated and the inconvenience of aligning upper and lower bodies is eliminated, and a method of manufacturing the probe pin.

In order to achieve the above object, according to one aspect of the present invention, there is provided a probe pin that has a two-piece structure consisting of a pogo pin part and a barrel part, in which the pogo pin part includes an upper plunger having an outside contact point at an upper end, a lower plunger having an outside contact point at a lower end, and a spring portion composed of one or more springs and connected to a lower end of the upper plunger and an upper end of the lower plunger; and the barrel part has a cylindrical shape surrounding a portion of the pogo pin part and has a barrel-fixing spring portion protruding on an outer side of the barrel part to apply elasticity outward.

According to another aspect of the present invention, there is provided a probe pin that includes: an upper plunger having an outside contact point at an upper end; a lower plunger having an outside contact point at a lower end; an upper spring connected a lower end of the upper plunger to absorb shock; a lower spring connected to an upper end of the lower plunger to absorb shock; and an inner barrel formed in a cylindrical shape between the upper spring and the lower spring and having a barrel-fixing spring portion protruding on an outer side of the inner barrel to apply elasticity outward.

According to another aspect of the present invention, there is provided a method of manufacturing a probe pin that includes: a punching step of forming a flat blank for forming a pogo pin part composed of an upper plunger, a lower plunger, and a spring portion, and for forming a barrel part having a barrel-fixing spring portion by punching a plate having elasticity; a forming step of bending the blank to a center portion from the outside to form the spring portion of the pogo pin part, of bending the upper plunger and the lower plunger in a cylindrical shape, and of bending only a portion of the barrel part to surround the pogo pin part; and a combining step of additionally bending the barrel part bent to surround the pogo pin part.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 3:
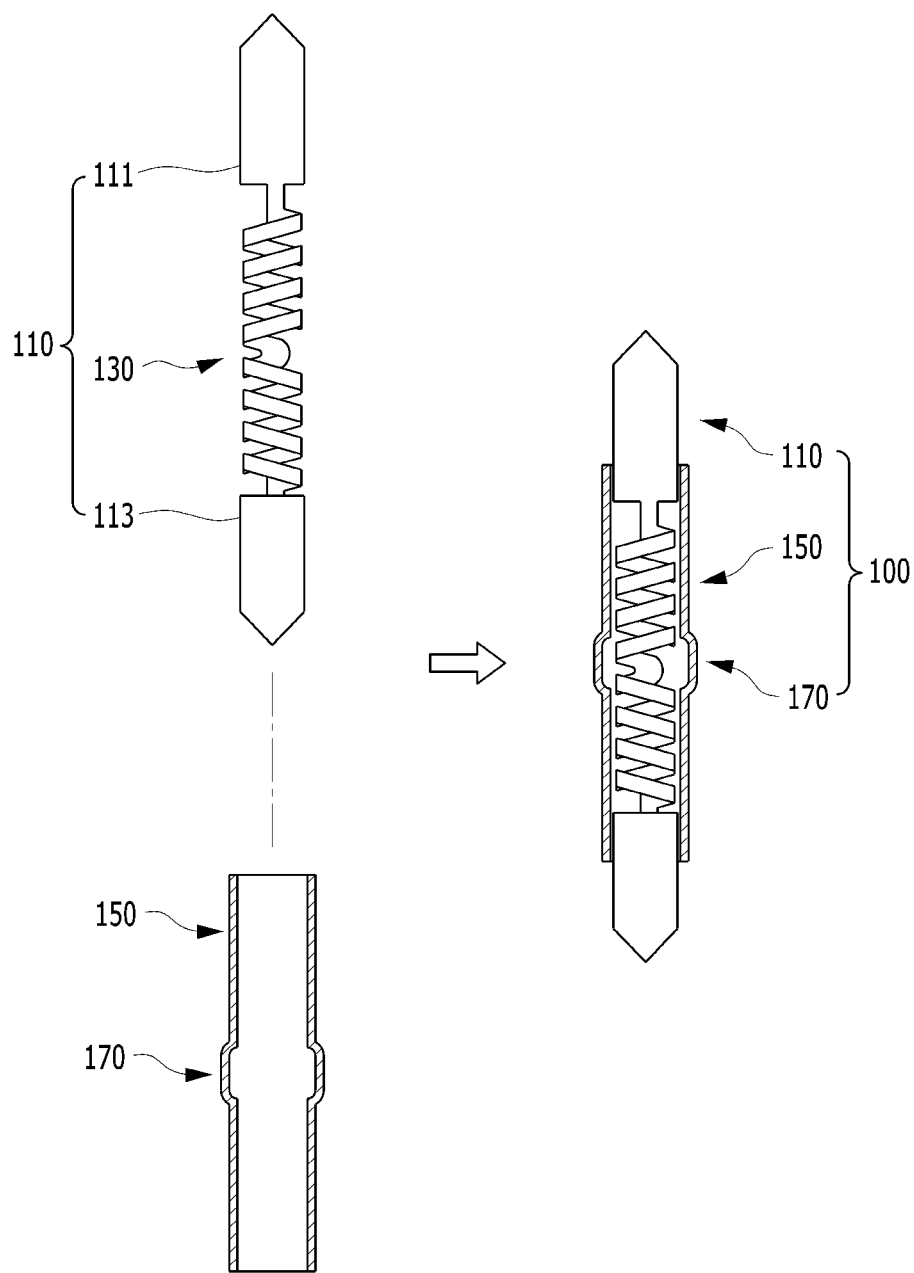
FIG. 3 is a view showing a combining structure of a probe pin according to a first embodiment of the present invention.
Figure 4:
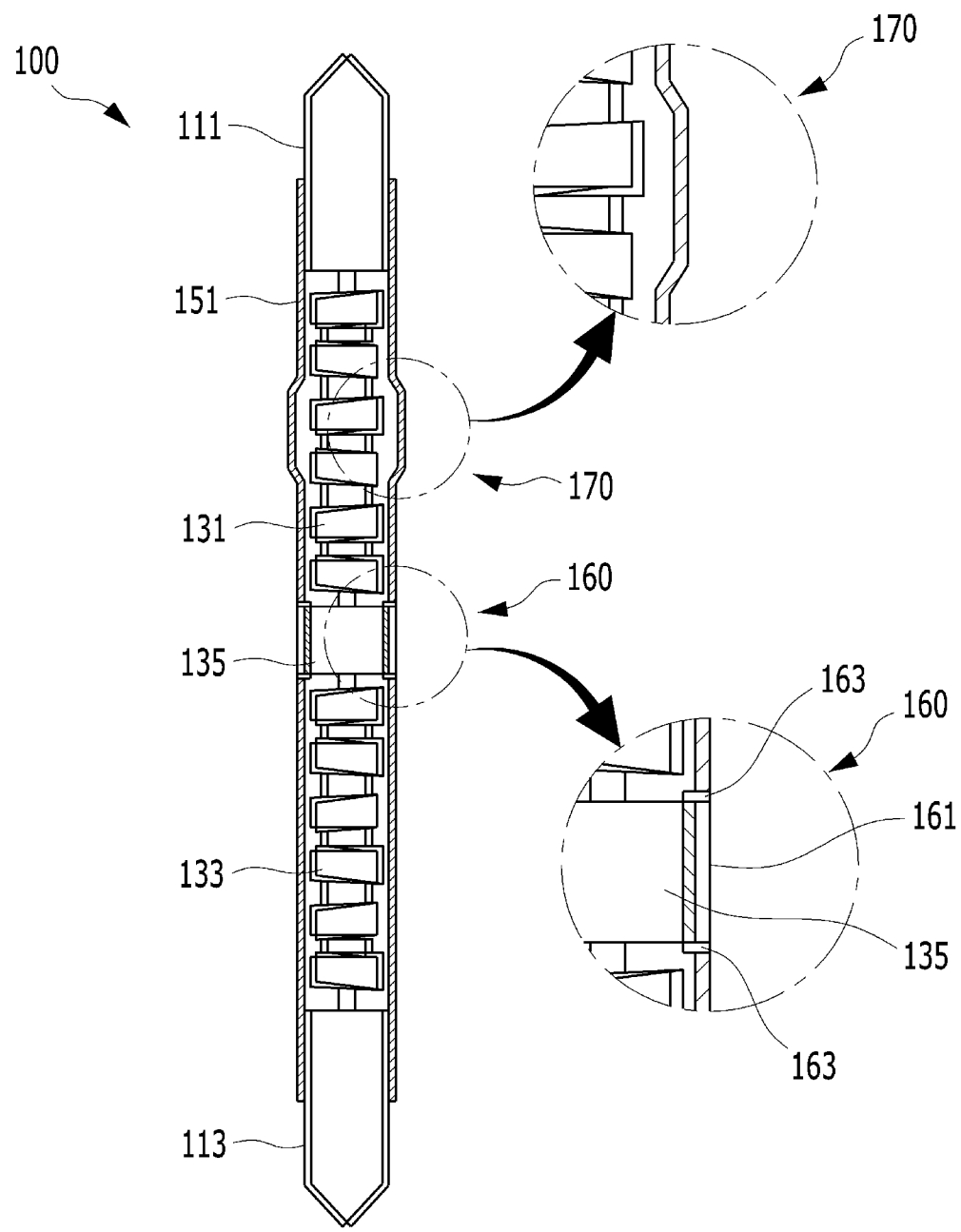
FIG. 4 is a cross-sectional view of FIG. 3.
Figure 5:
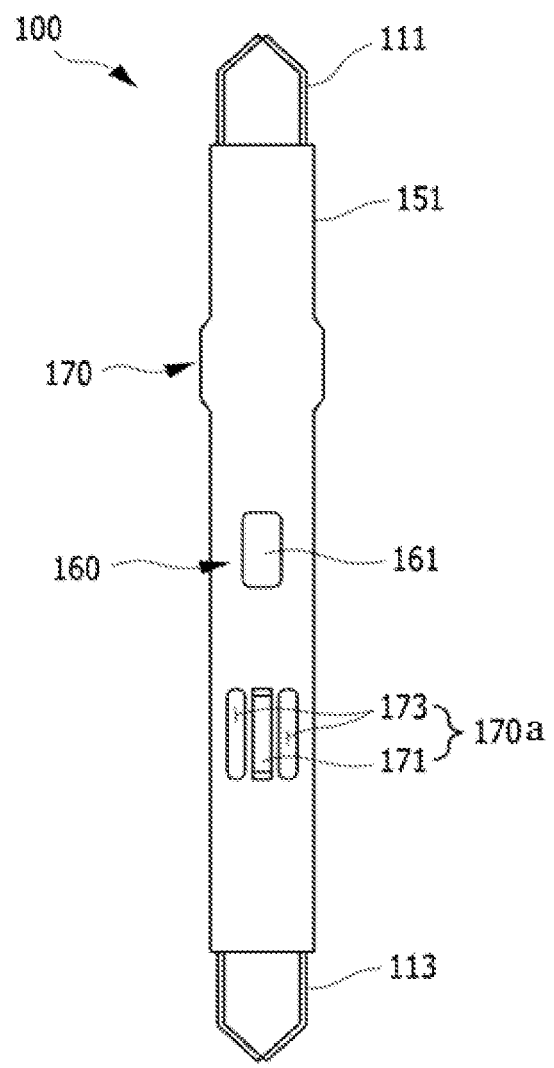
FIG. 5 is a front view of FIG. 3.

FIG. 3 is a view showing a combining structure of a probe pin according to a first embodiment of the present invention, FIG. 4 is a cross-sectional view of FIG. 3, and FIG. 5 is a front view of FIG. 3.

As shown in FIGS. 3 to 5, a probe pin according to a first embodiment of the present invention has a two-piece structure consisting of a pogo pin part 110 and a barrel part 150.

The pogo pin part 110 is made of a conductive material and has an upper plunger 111 and a lower plunger 113 and a spring portion 130 integrally formed between the plungers, in which the outside contact point of the upper plunger, the spring portion 130, and the outside contact point of the lower plunger 113 are electrically connected.

The upper plunger 111 and the lower plunger 113 are formed in a cylindrical shape to ensure straightness in the longitudinal direction (up-down direction) when the spring portion 130 elastically absorbs shock, but they may be formed in the shape of a polygon or a plate, if necessary.

The contact points of the upper plunger 111 and the lower plunger 113 are triangular single contact points, but they may be formed in various shapes such as crown-shaped multi-contact points, or flat and circular shapes.

The spring portion 130 may be composed of one or more springs, and if the spring portion 130 is formed by one spring, the lower ends of the upper plunger 111 and the lower plunger 113 are integrally connected to both ends of the spring.

When the spring portion 130 is composed of two or more springs, it is divided into an upper spring 131 and a lower spring 133 and a connector, for example, an inner barrel 135 is integrally formed between the springs 131 and 133.

In this configuration, when the inner barrel 135 is fixed to the barrel part 150, the pogo pin part 110 makes double strokes in which upper and lower loads or movements are separately made.

If the inner barrel 135 is not fixed to the barrel part 150, the pogo pin part 110 makes a single stroke of one up-down movement.

A stopper 163 recessed inward on the barrel part 150 may be used to fix the inner barrel 135 to the barrel part 150.

The inner barrel 135 may be fixed in various ways and may be fixed by a plating solution in a coupling groove 161 formed at a coupling portion 160 of the barrel part 150.

The barrel part 150 closes at sides to prevent dirt from flowing into the pogo pin part 110 when it is combined with the pogo pin part 110 and has the inner side formed in the same shape as the outer sides of the plungers 111 and 113 so the straightness is ensured when the upper plunger 111 or the lower plunger 113 is moved up and down by the spring portion 130.

A barrel body 151 of the barrel part 150 is generally formed in a cylindrical shape, but may be formed in other shapes including a polygonal.

Further, the barrel part 150 has barrel-fixing spring portions 170 to be fixed to a housing (socket) described below.

The barrel-fixing spring portions 170, 170a are barrel-fixing spring plates 171 formed by forming two barrel-fixing spring grooves 173 in parallel with each other in the longitudinal direction and pushing the longitudinal plate portions between the spring grooves 173, and apply elastic force outward.

The barrel part 150 is fixed in a hole of a housing or a socket outside the barrel part 150 by the elasticity.

Figure 11:
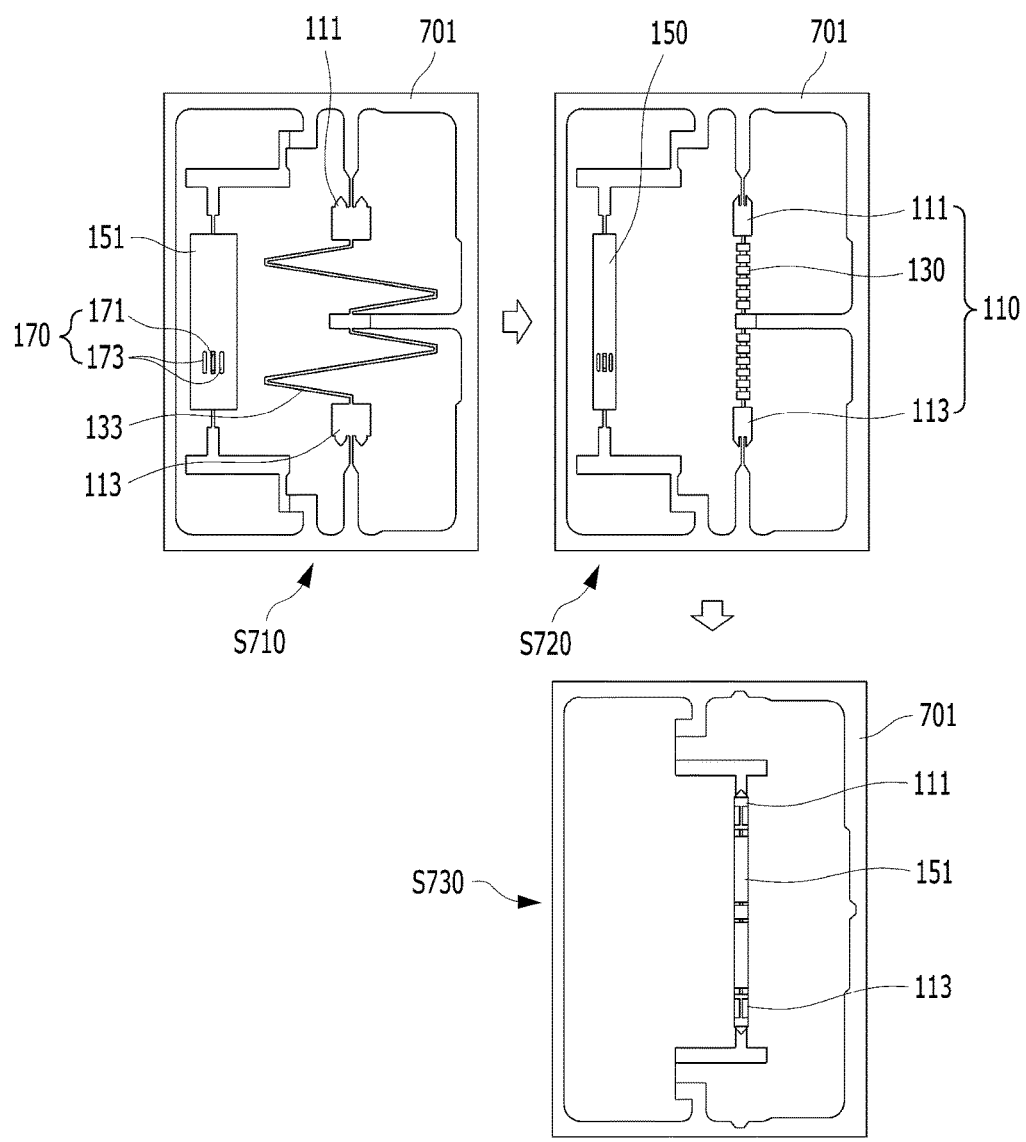
FIG. 11 is a view showing the processes in a method of manufacturing the probe pin according to the first embodiment of the present invention.

FIG. 11 is a view showing the processes in a method of manufacturing the probe pin according to the first embodiment.

As shown in FIG. 11, the method of manufacturing the probe pin according to the first embodiment includes a punching step S710, a forming step S720, and a combining step S730.

It is a detailed method of manufacturing a probe pin that absorbs up-down pressure (load) using elasticity, has an electrically connected contact point structure, and is fixed to a housing at the outside by elasticity of a spring.

First, the punching step S710 is a process of punching an elastic plate 701, that is, forming a flat blank for forming the pogo pin part 110 composed of the upper plunger 111, the lower plunger 113, and the spring portion 130, and the barrel part 150 having the barrel-fixing spring portion 170.

In the punching step S710, a plate 701 is punched to be used at the next step, the forming step S720, by punching a plate for manufacturing a probe pin.

The upper plunger 111, the lower plunger 113, and the spring portion 130 are connected in a single unit so that the pogo pin part 110 has minimum electric resistance after being manufactured.

The forming step S720 is a process of bending at least one or more mountain-shaped punched portions inward to the center from the outside to form the spring portion 130 of the pogo pin part 110 after the punching step S710, of bending the upper plunger 111 and the lower plunger 113 in a cylindrical shape, and of bending only a portion of the barrel part 150 to surround the pogo pin part 110 later.

In particular, the pogo pin part 110 and the barrel part 150 are formed at different spaces, in which the barrel part 150 is not formed into the final shape, but bent such that it can be combined with the pogo pin part 110.

The barrel-fixing spring portions 170, 170a are formed on the barrel part 150 by performing a step of forming the spring plate 171 by forming two barrel-fixing spring grooves 173 in parallel with each other at the side of the barrel part 150 to form a longitudinal plate portion and then pushing the plate portion.

Finally, the combining step S730 is a process of completing the probe pin by additionally bending the barrel part 150, that is, a process of surrounding the pogo pin part 110 with the barrel part 150 not completely bent in the forming step S720 and then additionally bending the barrel part 150 to complete the probe pin.

Figure 6:
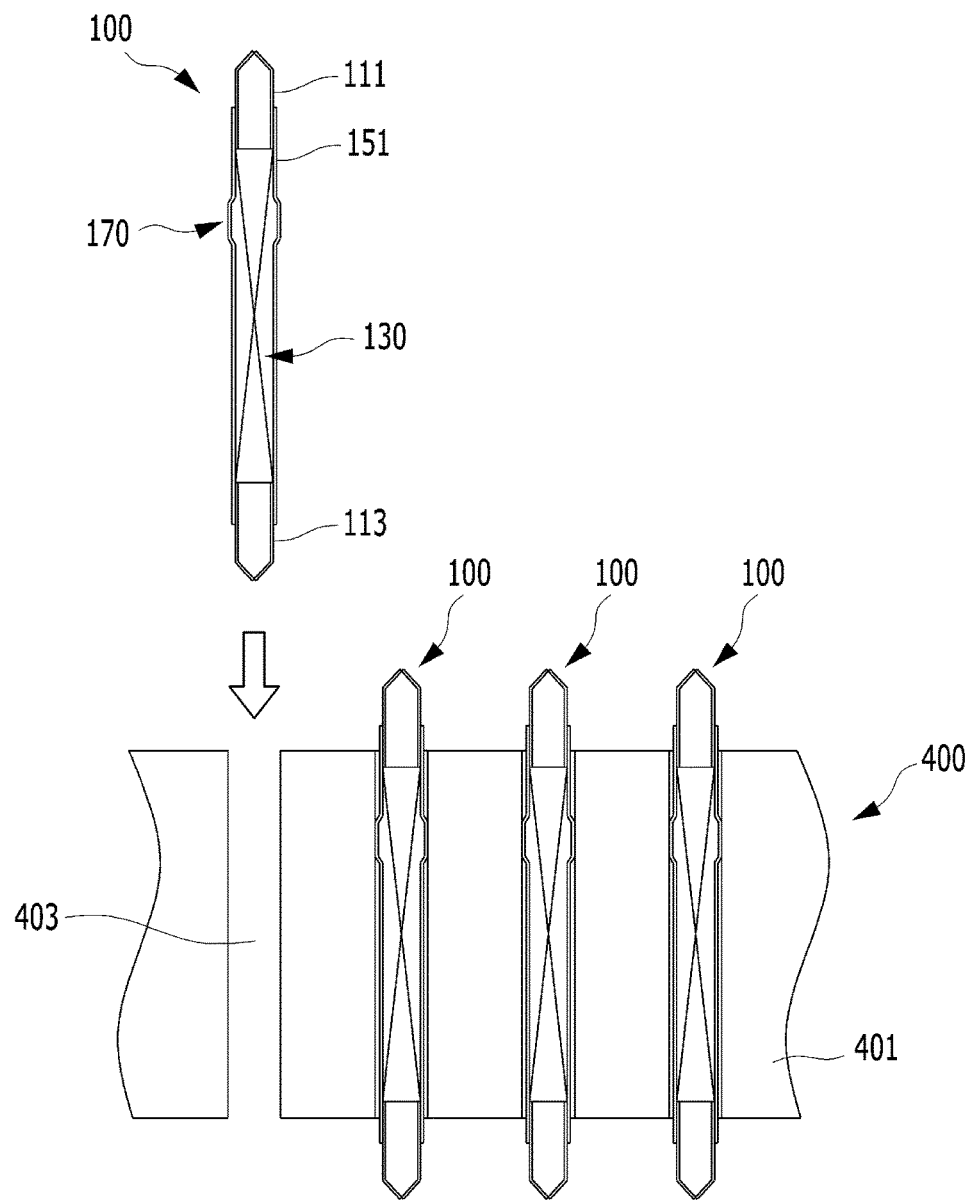
FIG. 6 is a cross-sectional view showing a housing combining structure of the probe pin shown in FIG. 3.

FIG. 6 is a cross-sectional view showing a housing combining structure of the probe pin shown in FIG. 3;

As shown in FIG. 6, a probe pin housing 400 is composed of a housing body 410 and housing holes 403.

The housing body 401 means all of bodies for fixing the housing of an interposer for examining a semiconductor wafer, or a probe pin 100 of a cameral module or a test module for testing a PCB, and may not be specified to a specific shape, but may be formed in various shapes as a fixing body for the probe pin 100.

The material of the housing body 401 can be any one of non-conductive materials and may be plastic-based materials.

The housing holes 403 are formed up and down through one housing body 401, in a cylindrical shape having a diameter allowing the probe pin 100 to be fixed by elasticity applied outward from the barrel-fixing spring portion 170 of the probe pin 100.

Figure 7:
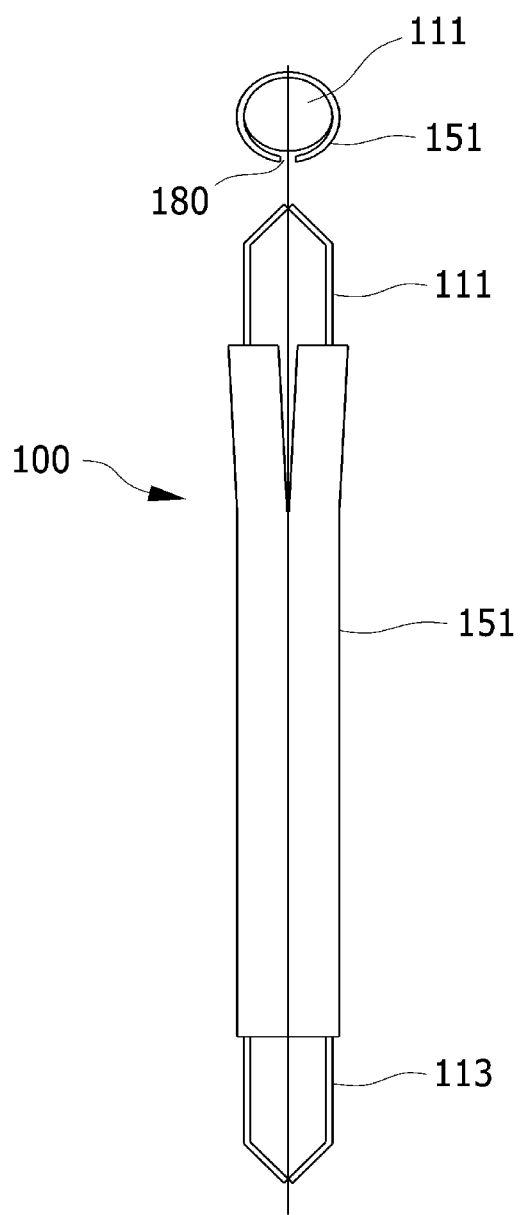
FIG. 7 is a front view of a probe pin according to a second embodiment of the present invention.

FIG. 7 is a front view of a probe pin according to a second embodiment of the present invention.

Unlike the barrel-fixing spring portion 170 having the barrel-fixing spring plate 171 protruding on the side of the barrel part 150 in the probe pin according to the first embodiment shown in FIG. 4, a barrel part 150 has a coupling portion 180 for fixing the barrel part 150 to the probe pin housing 400.

The coupling portion 180 is formed but longitudinally cutting at least one or more portions of the barrel part 150 outside the pogo pin part 110 and the coupling portion 180 is bent to open outward, so elasticity is applied inward and outward.

Figure 8:
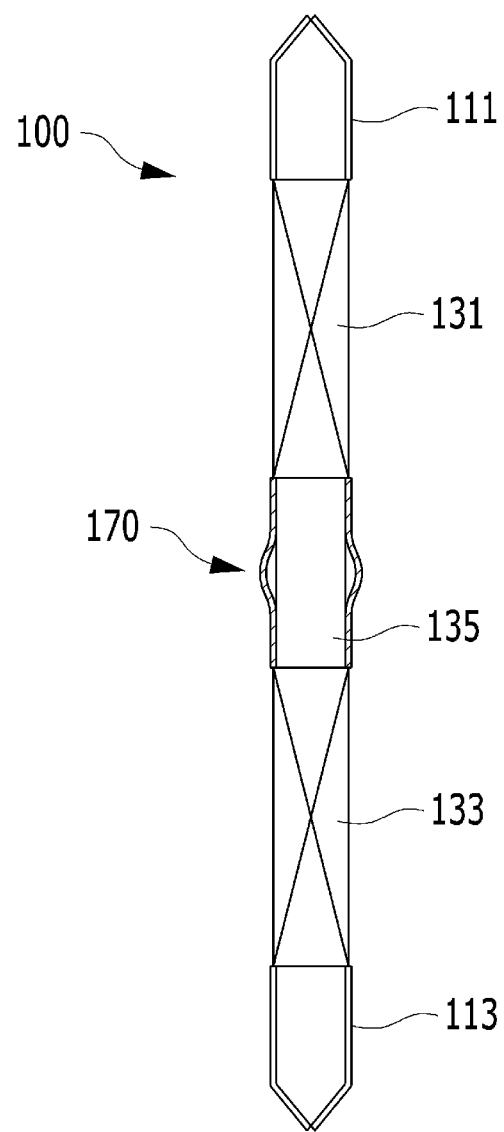
FIG. 8 is a front view of a probe pin according to a third embodiment of the present invention.

FIG. 8 is a front view of a probe pin according to a third embodiment of the present invention.

A probe pin 100 shown in FIG. 8 includes an upper plunger 111 a having an outside contact point at the upper end, a lower plunger 113 having an outside contact pin at the lower end, an upper spring 131 connected to the lower end of the upper plunger 111 to absorb shock, a lower spring 133 connected to the upper end of the lower plunger 113 to absorb shock, and an inner barrel 135 formed in a cylindrical shape between the upper spring 131 and the lower spring 133 and having a barrel-fixing spring portion 170 protruding to apply elasticity outward.

That is, a separate barrel part 150 is not provided outside the probe pin 100, but the barrel-fixing spring portion 170 is formed on the inner barrel 135.

The structure of the barrel-fixing spring portion 170 is the same as that of the barrel-fixing spring portion 170 of the first embodiment, so detailed description is not provided herein.

According to the third embodiment, the barrel-fixing spring portion 170 is formed on the outer side of the inner barrel 135 so that the probe pin 100 can be inserted in the housing hole 143 of the housing body 141. Accordingly, the probe pin 100 can be simply inserted into the housing hole 143 and the spring portion 130 of the probe pin 100 applies elasticity inward and outward in the housing hole 143 of the housing body 141 to keep the probe pin 100 in the housing hole 143.

Figure 9:
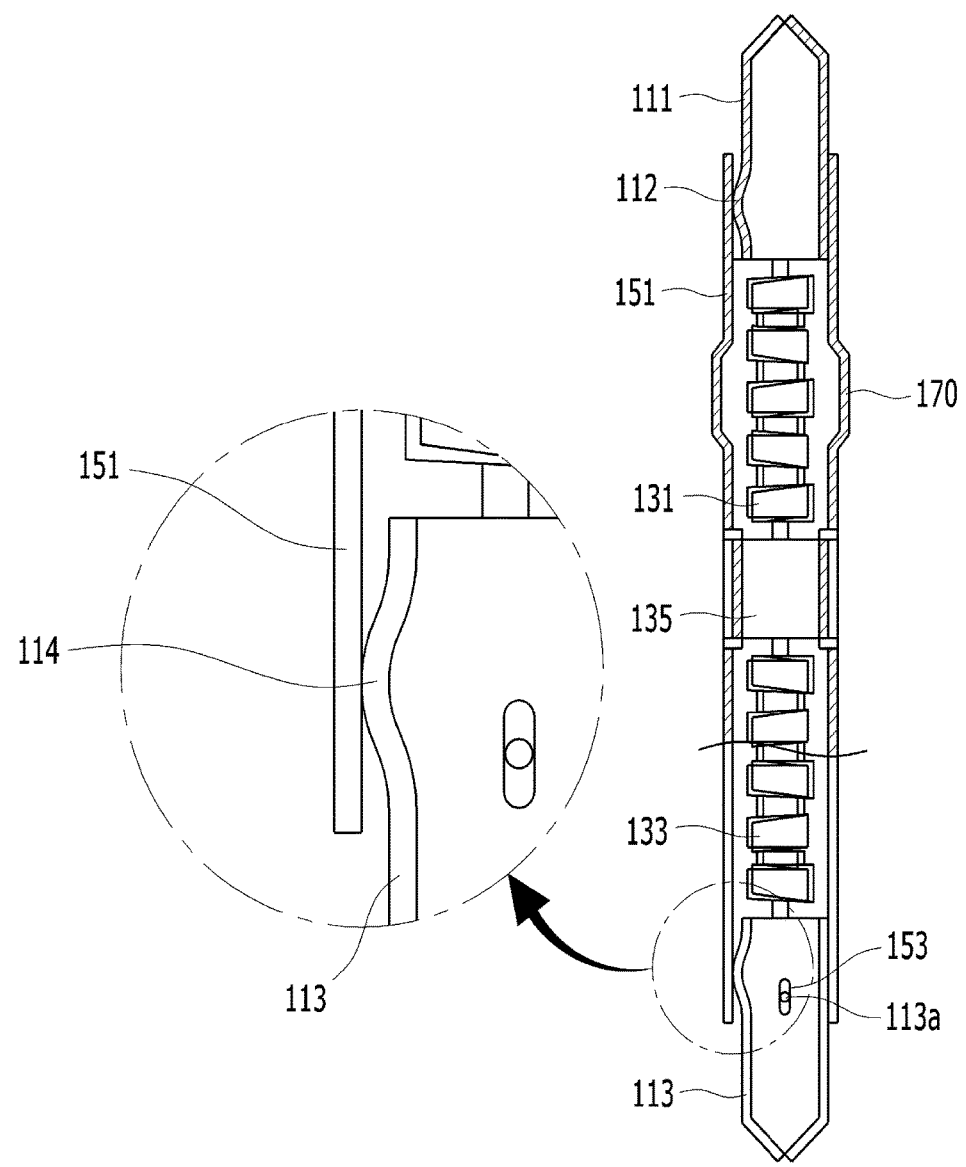
FIG. 9 is a partial cross-sectional view of a probe pin according to a fourth embodiment of the present invention.

FIG. 9 is a partial cross-sectional view of a probe pin according to a fourth embodiment of the present invention.

The fourth embodiment further includes a guide protrusion 113a, a guide hole 153, and elastic pressing portions 112 and 114 in the probe pin 100 according to the first embodiment of FIG. 4.

That is, the guide protrusion 113a is formed on the outer side of one or both of the upper plunger 111 and the lower plunger 113 and the guide hole 153 is formed in an oblong shape at the barrel body 151 of the barrel part 150 to correspond to the guide protrusion 113a in order to guide the guide protrusion moving up and down to absorb shock and prevent the barrel part 150 from separating from the upper plunger 111 and the lower plunger.

The elastic pressing portions 112 and 114 applying elasticity inward and outward are convexly formed by cutting and bending a portion of each of the upper plunger 111 and the lower plunger 113 to be opposite to each other so that the upper plunger 111 and the lower plunger 113 are elastically in contact with the inner side of the barrel part 150.

The guide protrusion 113a does not protrude outward from the barrel body 151.

Figure 10:
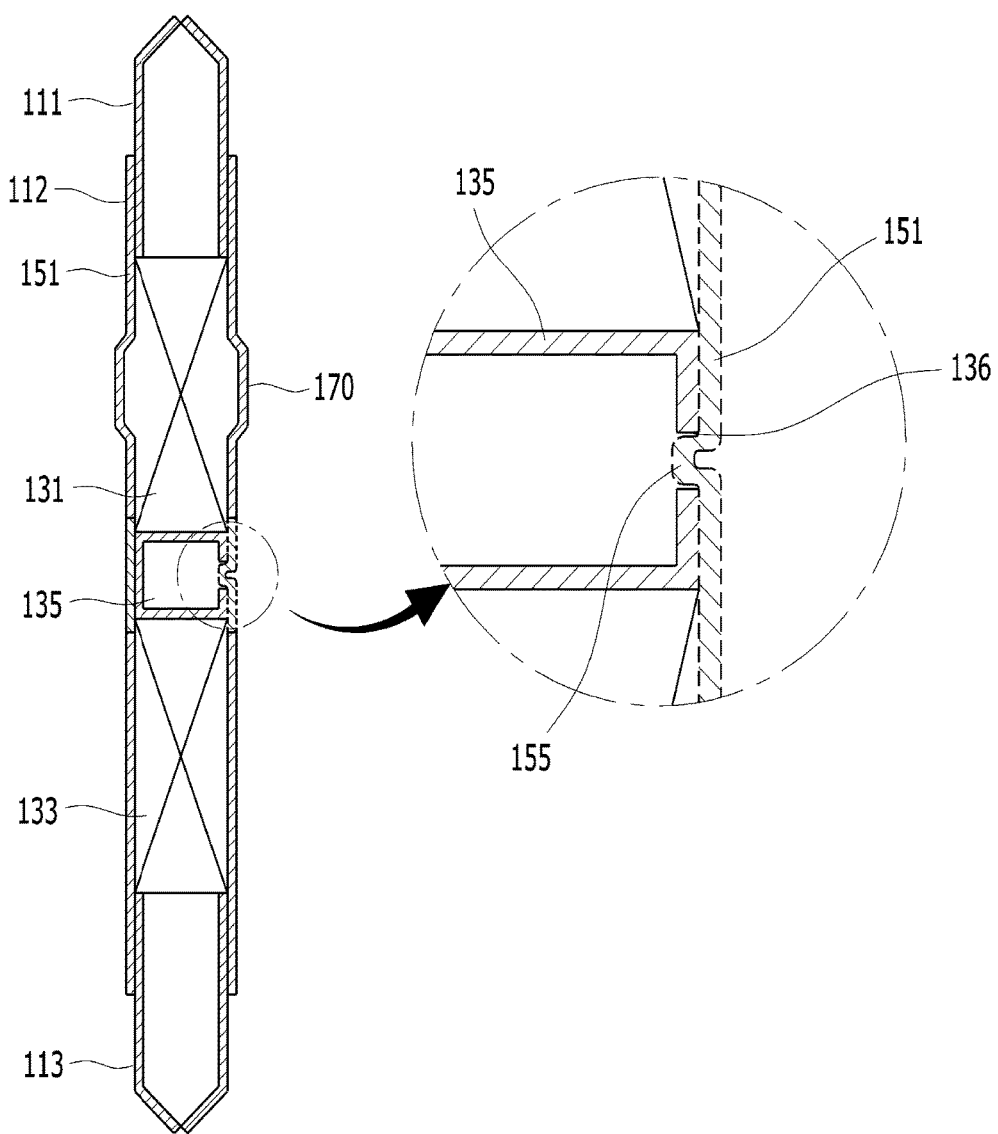
FIG. 10 is a cross-sectional view of a probe pin according to a fifth embodiment of the present invention.

FIG. 10 is a cross-sectional view of a probe pin according to a fifth embodiment of the present invention.

Unlike the first embodiment of FIG. 4 in which the stopper 163 or the coupling groove 161 are formed to fix the inner barrel 135 to the barrel part 150 in the probe pin 100, according to the fifth embodiment, a fixing protrusion 155 protrudes inward on the barrel body 151 of the barrel part 150 and a fixing hole 136 is formed in the inner barrel 135 at the position corresponding to the fixing protrusion 155 to be fitted on the fixing protrusion 155, thereby fixing the inner barrel 135 to the barrel part 150.

In contrast, the fixing hole may be formed in the barrel body 151 of the barrel part 150 and the fixing protrusion may be formed on the outer side of the inner barrel 135.

Accordingly, the probe pin 100 makes double strokes in which upper and lower loads or movements are separately made.

In the probe pin 100 according to the fifth embodiment, the outside contact point at the upper end of the upper plunger 111 and the outside contact point at the lower end of the lower plunger 113 have a circular structure.

Figure 12:
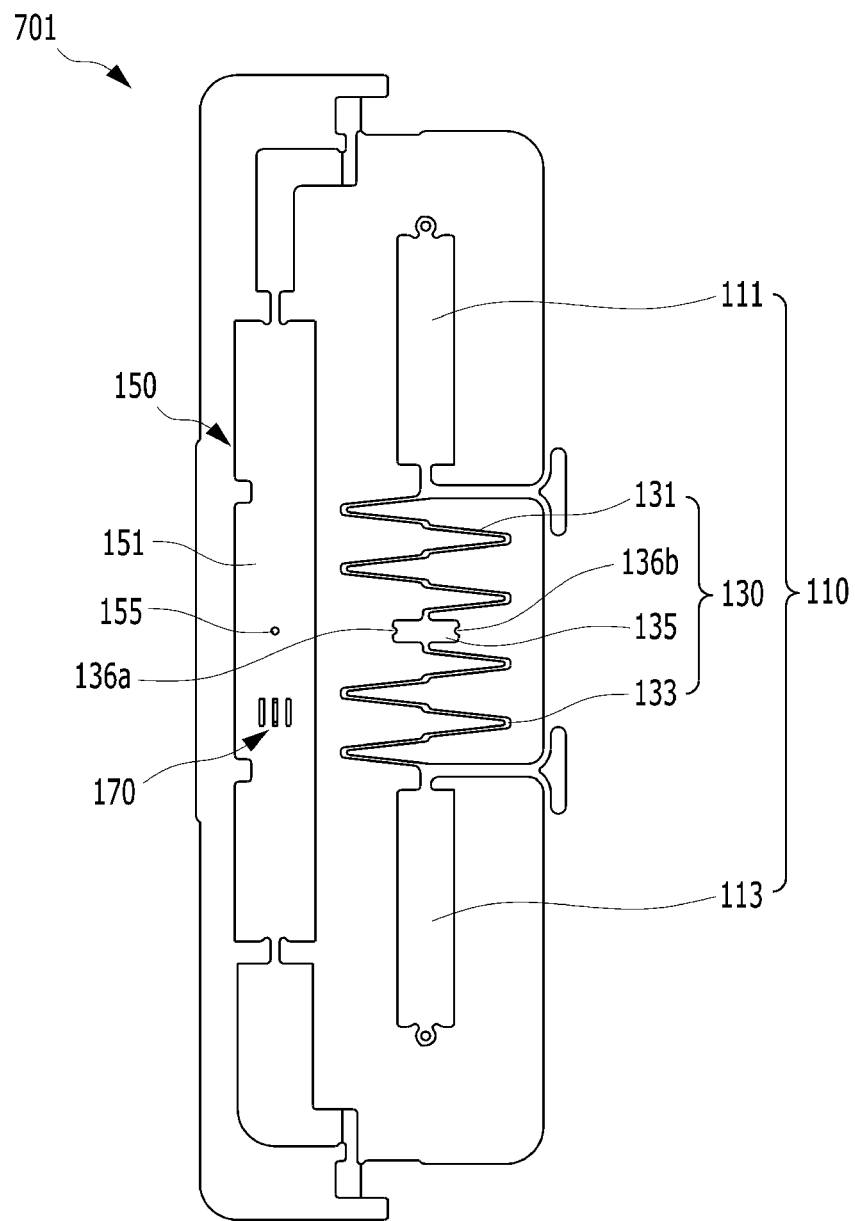
FIG. 12 is a view showing a plate in a punching process for illustrating a fixing projection and a fixing hole of the probe pin according to the fifth embodiment of the present invention.

FIG. 12 is a view showing a plate in a punching process for illustrating a fixing projection and a fixing hole of the probe pin according to the fifth embodiment of the present invention.

First, in the punching step S710, an elastic plate 701 is punched, that is, a flat blank for forming the pogo pin part 110 composed of the upper plunger 111, the lower plunger 113, and the spring portion 130, and the barrel part 150 having the barrel-fixing spring portion 170 is formed.

The upper plunger 111, the lower plunger 113, and the spring portion 130 are connected in a single unit so that the pogo pin part 110 has minimum electric resistance after being manufactured.

Further, the fixing protrusion 155 is formed on the barrel body 151 of the barrel part 150 and semicircular grooves 136a and 136b are formed at both sides of the inner barrel 135 by the punching step.

Thereafter, in the forming step S720, the upper plunger 111, the lower plunger 113, and the spring portion 130 are formed in a cylindrical shape by bending punched portions inward to the center from the outside, and only a portion of the barrel part 150 is bent to surround the pogo pin part 110.

The semicircular grooves 136a and 136b at both sides of the inner barrel 135 are connected to each other to form the circular fixing groove 136 in the forming step, and then in the combining step S730, the fixing protrusion 155 of the barrel body 151 is fitted into the fixing hole 136 of the inner barrel 135.

Figure 13:
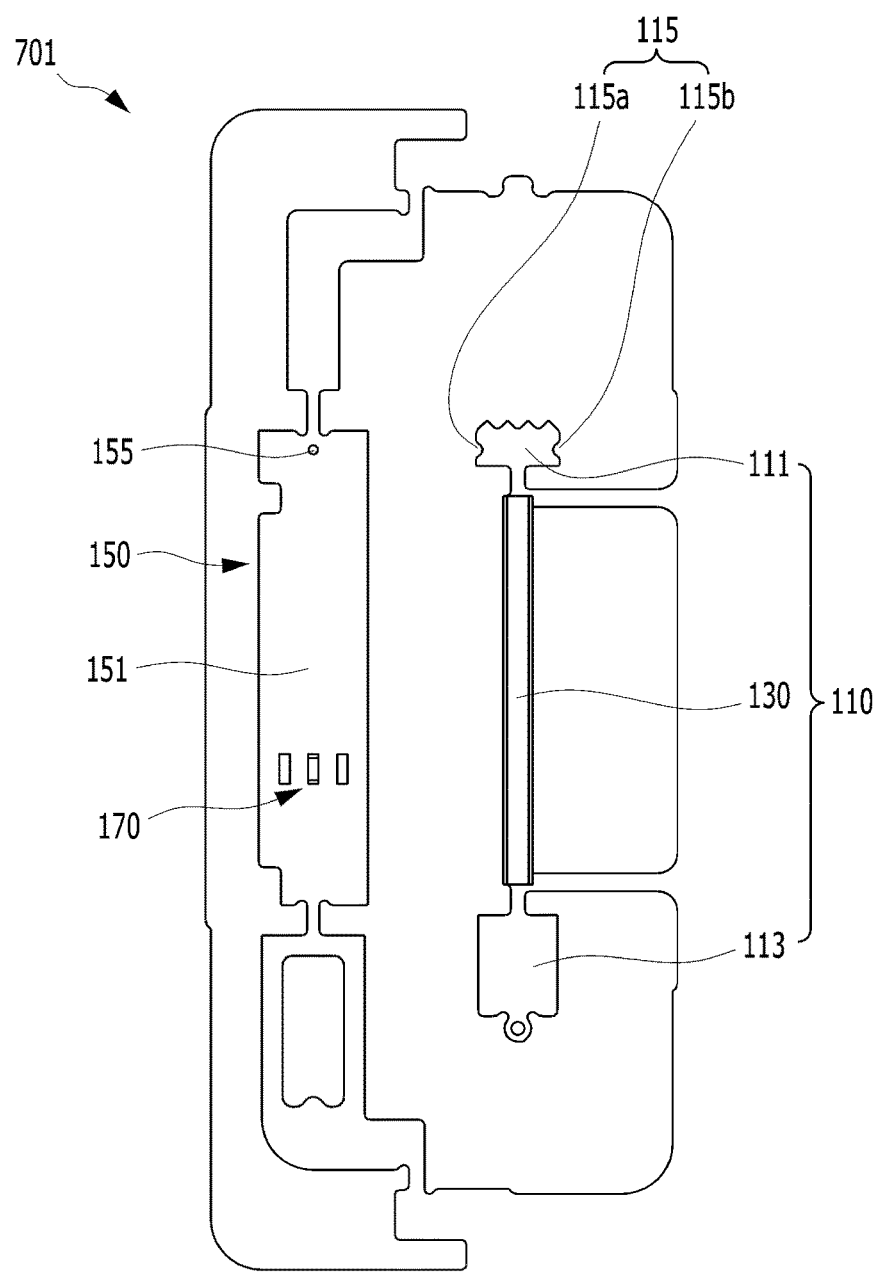
FIG. 13 is a view showing a plate in a punching process for illustrating a fixing projection and a fixing hole of a probe pin according to a sixth embodiment of the present invention.

FIG. 13 is a view showing a plate in a punching process for illustrating a fixing projection and a fixing hole of a probe pin according to a sixth embodiment of the present invention.

In the probe pin 100 according to the sixth embodiment, a fixing protrusion 155 protruding inward is formed on the barrel body 151 of the barrel part 150 to fix the pogo pin part 110 to the barrel part 150 and a fixing hole 115 is formed in the upper plunger 111 at the position corresponding to the fixing protrusion 155 to be fitted on the fixing protrusion 155, thereby making a single stroke of one up-down load or movement.

Obviously, a barrel-fixing spring portion 170 is formed to fix the barrel part 150 to the housing (socket) 400 in the probe pin 100 according to the sixth embodiment.

First, in the punching step S710, an elastic plate 701 is punched, that is, a flat blank for forming the pogo pin part 110 composed of the upper plunger 111, the lower plunger 113, and the spring portion 130, and the barrel part 150 having the barrel-fixing spring portion 170 is formed.

The upper plunger 111, the lower plunger 113, and the spring portion 130 are connected in a single unit so that the pogo pin part 110 has minimum electric resistance after being manufactured.

Further, the fixing protrusion 155 is formed on the barrel body 151 of the barrel part 150 and semicircular grooves 115a and 115b are formed at both sides of the upper plunger 111 by the punching step.

Thereafter, in the forming step S720, the upper plunger 111, the lower plunger 113, and the spring portion 130 are formed in a cylindrical shape by bending punched portions inward to the center from the outside, and only a portion of the barrel part 150 is bent to surround the pogo pin part 110.

The semicircular grooves 115a and 115b at both sides of the upper plunger 111 are connected to each other to form the true circular fixing groove 136 in the forming step, and then in the combining step S730, the fixing protrusion 155 of the barrel body 151 is fitted into the fixing hole 115 of the upper plunger 111.

Accordingly, the upper plunger 111 is fixed and only the lower plunger 113 is moved up/down by the spring portion 130.

Figure 14:
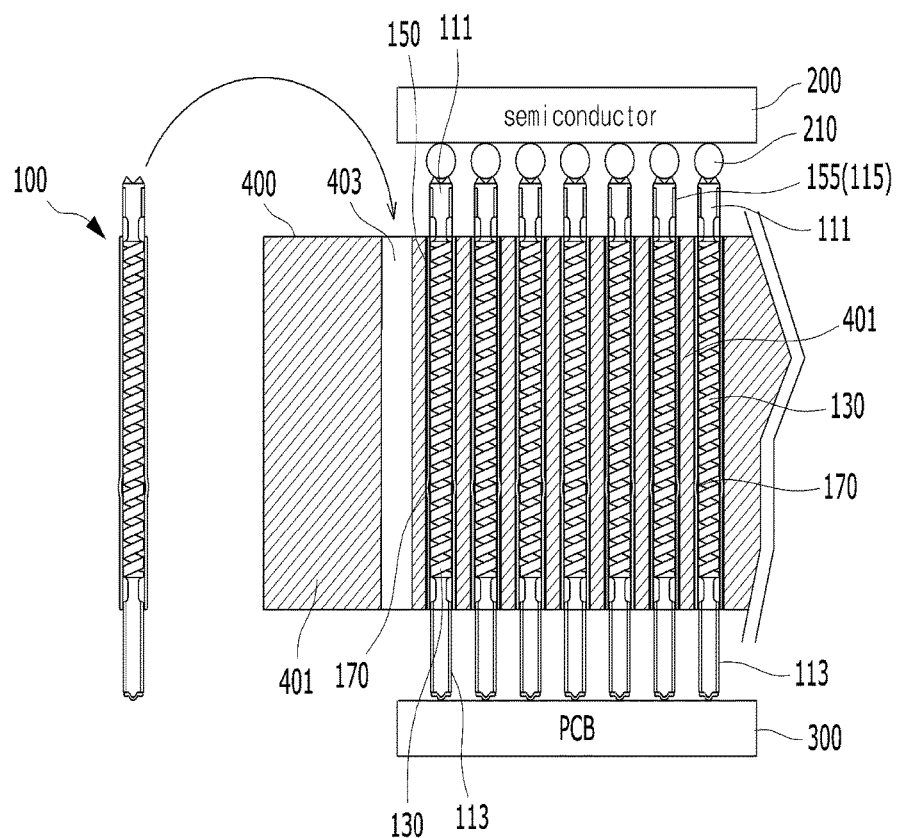
FIG. 14 is a cross-sectional view showing a housing combining structure of the probe pin according to the sixth embodiment manufactured by the processes shown in FIG. 13.

FIG. 14 is a cross-sectional view showing a housing combining structure of the probe pin according to the sixth embodiment manufactured by the processes shown in FIG. 13.

As shown in FIG. 14, a probe pin housing 400 is composed of a housing body 410 and housing holes 403.

The housing body 401 means all of bodies for fixing the housing of an interposer for examining a semiconductor wafer, or a probe pin 100 of a cameral module or a test module for testing a PCB, and may not be specified to a specific shape, but may be formed in various shapes as a fixing body for the probe pin 100.

The material of the housing body 401 can be any one of non-conductive materials and may be plastic-based materials.

The outside contact point at the upper end of the upper plunger 111 is a multi-contact point having a crown shape for electric connection by coming in contact with a ball 210 of a semiconductor and the outside contact point at the lower end of the lower plunger 113 has a circular structure for electric connection by coming in contact with a PCB 300.

The housing holes 403 are formed up and down through one housing body 401, in a cylindrical shape having a diameter allowing the probe pin 100 to be fixed by the barrel-fixing spring portion 170 of the probe pin 100.

Figure 1:
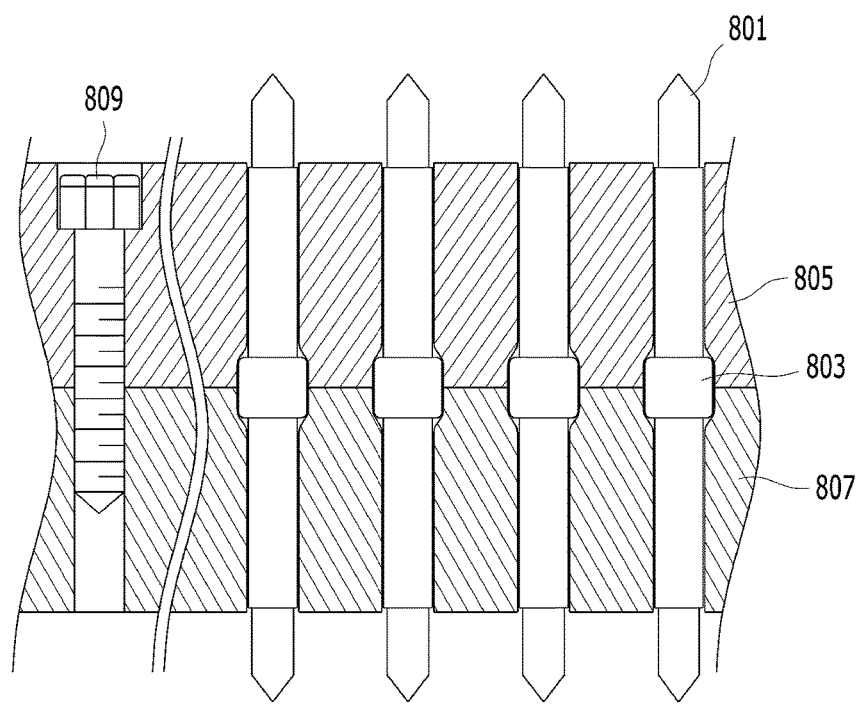
FIGS. 1 and 2 are a cross-sectional views and an exploded view showing a socket combining structure of a probe pin of the related art, respectively.
Figure 2:
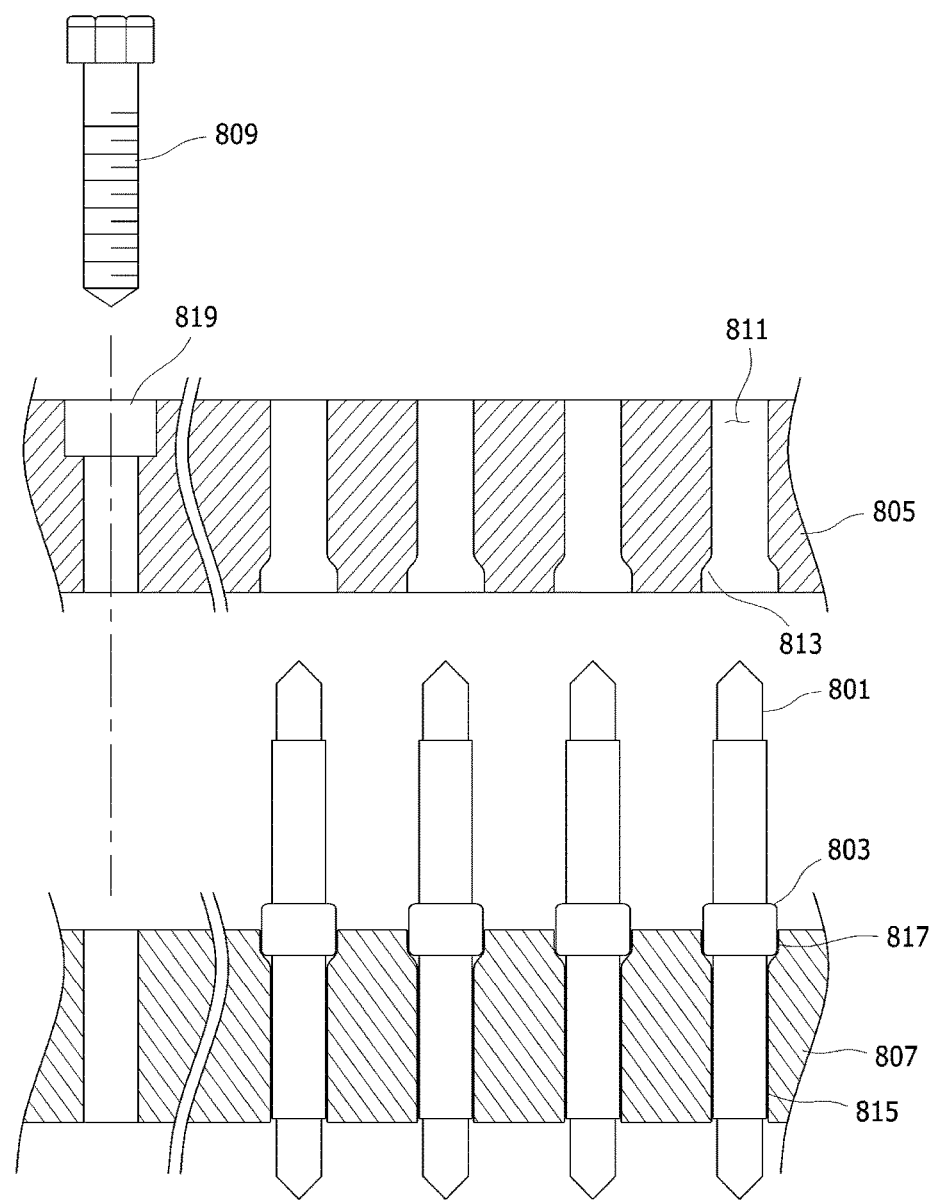

Although the housing body 401 is a single unit in the embodiments, the probe pin may be combined with a housing body that is divided in two parts, as in FIG. 1.

What is claimed is:

1. A probe pin having a two-piece structure consisting of a pogo pin part and a barrel part,
    wherein the pogo pin part includes an upper plunger having an outside contact point at an upper end, a lower plunger having an outside contact point at a lower end, and a spring portion composed of one or more springs and connected to a lower end of the upper plunger and an upper end of the lower plunger;
    the barrel part has a cylindrical shape surrounding a portion of the pogo pin part and has a barrel-fixing spring portion protruding on an outer side of the barrel part to apply elasticity outward,
    the spring portion includes an upper spring connected to the lower end of the upper plunger, a lower spring connected to the upper end of the lower plunger, and an inner barrel connecting the upper spring and the lower spring to each other, and
    the barrel part further has one or more coupling grooves formed by boring a barrel body of the barrel part and a stopper formed by bending inward a portion of the barrel body to fix the coupling groove and the inner barrel.

2. The probe pin of claim 1, wherein a fixing protrusion that protrudes inward is formed on a barrel body of the barrel part, a fixing hole is formed in the inner barrel at a position corresponding to the fixing protrusion, and the fixing protrusion is fitted in the fixing hole.

3. The probe pin of claim 1, wherein the barrel-fixing spring portion is a barrel-fixing spring plate formed by bending outward a plate portion between barrel-fixing spring grooves formed in parallel with each other in a barrel body of the barrel part.

4. The probe pin of claim 1, wherein the barrel-fixing spring portion is a coupling portion formed by bending outward a portion of a barrel body of the barrel part to apply elasticity outward when the barrel part is inserted in a housing hole of a housing body.

5. The probe pin of claim 1, wherein a guide protrusion is formed on the outer side of one or both of the upper plunger and the lower plunger, a guide hole is formed in an oblong shape at a barrel body of the barrel part to correspond to the guide protrusion, and the guide protrusion absorbs shock by moving along the guide hole.

6. The probe pin of claim 1, wherein elastic contact portions protruding to apply elasticity inward and outward is formed by cutting and bending the upper plunger and the lower plunger.

7. The probe pin of claim 1, wherein a fixing protrusion that protrudes inward is formed on a barrel body of the barrel part, a fixing hole is formed in the upper plunger or the lower plunger at a position corresponding to the fixing protrusion, and the fixing protrusion is fitted in the fixing hole.

8. A probe pin comprising:
   an upper plunger having an outside contact point at an upper end;
   a lower plunger having an outside contact point at a lower end;
   an upper spring connected a lower end of the upper plunger to absorb shock;
   a lower spring connected to an upper end of the lower plunger to absorb shock; and
   an inner barrel formed in a cylindrical shape between the upper spring and the lower spring and having a barrel-fixing spring portion protruding on an outer side of the inner barrel to apply elasticity outward.

* * * * *